United States Patent
Oi et al.

(10) Patent No.: US 10,211,068 B2
(45) Date of Patent: Feb. 19, 2019

(54) POWER-MODULE SUBSTRATE WITH COOLER AND METHOD OF PRODUCING THE SAME

(71) Applicant: MITSUBISHI MATERIALS CORPORATION, Tokyo (JP)

(72) Inventors: Sotaro Oi, Kitamoto (JP); Tomoya Oohiraki, Kitamoto (JP); Takeshi Kitahara, Kitamoto (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 15/518,347

(22) PCT Filed: Oct. 9, 2015

(86) PCT No.: PCT/JP2015/078765
§ 371 (c)(1),
(2) Date: Apr. 11, 2017

(87) PCT Pub. No.: WO2016/060079
PCT Pub. Date: Apr. 21, 2016

(65) Prior Publication Data
US 2017/0309499 A1 Oct. 26, 2017

(30) Foreign Application Priority Data

Oct. 16, 2014 (JP) .................................. 2014-211529
Oct. 9, 2015 (JP) .................................. 2015-200784

(51) Int. Cl.
*B23K 20/00* (2006.01)
*H01L 21/48* (2006.01)
(Continued)

(52) U.S. Cl.
CPC .......... *H01L 21/4882* (2013.01); *B23K 20/02* (2013.01); *H01L 23/3735* (2013.01);
(Continued)

(58) Field of Classification Search
CPC ... H01L 21/4882; H01L 23/3736; H05K 3/20; H05K 1/0203; B23K 1/0016;
(Continued)

(56) References Cited

U.S. PATENT DOCUMENTS 6,071,389 A * 6/2000 Zhang .................. B23K 20/021
204/298.12
6,164,524 A * 12/2000 Iwadachi ............. B23K 20/233
228/193
(Continued)

FOREIGN PATENT DOCUMENTS

DE 102013208350 A1 11/2013
EP 1306207 A1 5/2003
(Continued)

OTHER PUBLICATIONS

Machine translation of JP 2013-214576A (no date available).*
(Continued)

*Primary Examiner* — Kiley S Stoner
(74) *Attorney, Agent, or Firm* — Locke Lord LLP; James E. Armstrong, IV; Nicholas J. DiCeglie, Jr.

(57) ABSTRACT

Preventing a deformation when a metal layer made of copper or copper alloy is brazed on an aluminum-made cooler, a power-module substrate with cooler having low thermal resistance and high bonding reliability is provided: a circuit layer made of copper or copper alloy is bonded on one surface of a ceramic board and a metal layer made of copper or copper alloy is bonded on the other surface of the ceramic board; a second metal layer made of aluminum or aluminum alloy is bonded to the metal layer by solid-phase diffusion; and a cooler made of aluminum alloy is brazed on the second metal layer with Al-based Mg-included brazing material.

5 Claims, 4 Drawing Sheets

(51) Int. Cl.
*B23K 20/02* (2006.01)
*H01L 23/373* (2006.01)
*H05K 1/02* (2006.01)
*H05K 3/20* (2006.01)
*H01L 23/473* (2006.01)

(52) U.S. Cl.
CPC ........ *H01L 23/3736* (2013.01); *H01L 23/473* (2013.01); *H05K 1/0203* (2013.01); *H05K 3/20* (2013.01); *H01L 2924/0002* (2013.01)

(58) Field of Classification Search
CPC . B23K 2201/36–2201/42; B23K 20/00; B23K 20/02–20/026
USPC ........ 228/179.1–180.22, 245–262, 193–195, 228/121–124.7
See application file for complete search history.

(56) References Cited

U.S. PATENT DOCUMENTS

| | | | | |
|---|---|---|---|---|
| 6,286,750 | B1* | 9/2001 | Iwadachi | B23K 20/021 |
| | | | | 228/118 |
| 6,619,537 | B1* | 9/2003 | Zhang | B23K 20/002 |
| | | | | 204/298.12 |
| 9,905,437 | B2* | 2/2018 | Terasaki | H01L 21/4846 |
| 2002/0089828 | A1 | 7/2002 | Suzuki et al. | |
| 2006/0065517 | A1* | 3/2006 | Ivanov | B23K 20/021 |
| | | | | 204/192.12 |
| 2012/0202090 | A1* | 8/2012 | Yamamoto | B23K 1/19 |
| | | | | 428/651 |
| 2013/0299963 | A1* | 11/2013 | Otaki | H01L 23/36 |
| | | | | 257/712 |
| 2014/0111956 | A1* | 4/2014 | Taniguchi | B23K 35/02 |
| | | | | 361/771 |
| 2015/0055303 | A1 | 2/2015 | Nagatomo et al. | |
| 2015/0319877 | A1* | 11/2015 | Ohashi | C22C 13/00 |
| | | | | 361/728 |
| 2016/0035660 | A1* | 2/2016 | Terasaki | B32B 15/01 |
| | | | | 174/252 |
| 2016/0167170 | A1* | 6/2016 | Terasaki | B23K 35/286 |
| | | | | 219/121.61 |
| 2016/0181123 | A1* | 6/2016 | Terasaki | H01L 23/3735 |
| | | | | 228/122.1 |
| 2017/0062305 | A1* | 3/2017 | Terasaki | C04B 37/026 |
| 2017/0271237 | A1* | 9/2017 | Terasaki | H01L 21/4882 |
| 2017/0271238 | A1* | 9/2017 | Terasaki | H01L 23/3736 |

FOREIGN PATENT DOCUMENTS

| | | |
|---|---|---|
| JP | 2002-203932 A | 7/2002 |
| JP | 2006-245437 A | 9/2006 |
| JP | 2012-109315 A | 6/2012 |
| JP | 2013-214576 A | 10/2013 |
| JP | 2014060216 A | 4/2014 |
| JP | WO 2014/115677 A1 * | 7/2014 |
| JP | 2014-179463 A | 9/2014 |

OTHER PUBLICATIONS

International Search Report dated Dec. 15, 2015, issued for PCT/JP2015/078765.
Extended European Search Report issued in corresponding European Patent Application No. 15851276.4 dated Nov. 6, 2018.

* cited by examiner

POWER-MODULE SUBSTRATE WITH COOLER AND METHOD OF PRODUCING THE SAME

BACKGROUND OF THE INVENTION

Technical Field

The present invention relates to a power-module substrate with cooler used for a semiconductor device controlling large current and high voltage and a method of producing thereof.

Priority is claimed on Japanese Patent Applications No. 2014-211529, filed Oct. 16, 2014 and No. 2015-200784, filed Oct. 9, 2015, the content of which is incorporated herein by reference.

Background Art

As a conventional power-module substrate, it is a known structure that a circuit layer is bonded on one surface of a ceramic board to be an insulation layer, and a metal layer for thermal radiation is bonded on the other surface of the ceramic board. By bonding a cooler on the metal layer of this power-module substrate, a power-module substrate with cooler is manufactured. And semiconductor elements such as power elements and the like are mounted on the circuit layer with solder material therebetween, so that a power module is made.

In such power-module substrates as this kind, it is ordinarily used that a power-module substrate with cooler having a structure in which the circuit layer is made of copper or copper alloy which is excellent in thermal characteristic and electronic characteristic and the cooler is made of aluminum alloy.

For a power-module substrate of that kind, Patent Document 1 discloses to use silicon nitride, aluminum nitride, aluminum oxide or the like as a ceramic substrate, and bond a metal layer on this ceramic substrate by a direct bonding or an active-metal method, and also discloses to be desirable to use copper as that metal layer. Furthermore, it is disclosed to bond a heat sink to the power-module substrate by solder.

CITATION LIST

Patent Literature

Patent Document 1: Japanese Unexamined Patent Application, First Publication No. 2006-245437

SUMMARY OF INVENTION

Technical Problem

A solder layer bonding a metal layer and a heat sink has high thermal resistance and obstructs heat transmission from a semiconductor element to the heat sink; and may be broken by cracking owing to thermal expansion. Accordingly, brazing is remarked since it has low thermal resistance and high bonding reliability.

However, in a case in which a cooler made of aluminum having a cooling channel therein is bonded to a power-module substrate by brazing, since the brazing step is carried out by pressing stacked metal plate with brazing material therebetween in a stacking direction and heating them, the cooler made of aluminum may be deformed by the pressure.

The present invention is achieved in consideration of the above circumstances, and has an object to provide a power-module substrate with cooler in which a cooler made of aluminum is prevented from deforming when a metal layer made of copper or copper alloy is brazed, so that thermal resistance is low and bonding reliability is high.

Solution to Problem

A method of producing a power-module substrate with cooler according to the present invention includes a first bonding step of forming a circuit layer by bonding a metal plate made of copper or copper alloy on one surface of a ceramic board and forming a first metal layer by bonding a metal plate made of copper or copper alloy on the other surface of the ceramic board; a second bonding step of forming a second metal layer by bonding a metal plate made of aluminum or aluminum alloy, or nickel or nickel alloy on the first metal layer by solid-phase diffusion bonding; and a third bonding step of brazing a cooler made of aluminum alloy on the second metal layer with Al-based Mg-included brazing material.

In the method of producing of the present invention, the cooler made of aluminum alloy can be bonded with the Al-based Mg-included brazing material, because the second metal layer made of aluminum, aluminum alloy, nickel or nickel alloy is bonded on the first metal layer made of copper or copper alloy by solid-phase diffusion bonding. This brazing can be carried out in an atmosphere of nitrogen, argon or the like with low pressing load (e.g., 0.001 MPa to 0.5 MPa), so that it is possible to bond reliably without deformation even for the cooler made of aluminum having low rigidity.

It is preferable that in the second bonding step, with inserting a titanium foil between the first metal layer and the second metal layer, the first metal layer and the titanium foil, and the second metal layer and the titanium-foil be bonded respectively by the solid-phase diffusion bonding; and in the third bonding step, the second metal layer and the cooler be brazed with Al—Si—Mg-based brazing material.

By bonding the first metal layer and the second metal layer with the titanium foil therebetween by the solid-phase diffusion, titanium atoms are diffused into both the metal layers and aluminum atoms and copper atoms are diffused into the titanium foil, so that it is possible to bond the first metal layer, the titanium foil and the second metal layer reliably.

In this case, even though it is heated when the cooler is brazed after the second metal layer is bonded, since the titanium foil is inserted, aluminum and copper are prevented from diffusion while this brazing.

In this method of producing, it is desirable that an area of the titanium foil be larger than that of the first metal layer. In this case, it is possible to prevent contact of copper of the first metal layer made of copper or copper alloy with aluminum of Al-based Mg-included brazing material for bonding the cooler more reliably.

In this method of producing, in a case in which the second metal layer is formed using the metal plate made of aluminum or aluminum alloy, the melted Al-based Mg-included to brazing material is repelled by an oxide film on a side surface of the second metal layer made of aluminum or aluminum alloy and do not reach the first metal layer, because Mg having low wettability relative to an aluminum oxide film is included in the brazing material bonding the cooler. As a result, the first metal layer made of copper or copper alloy is not in contact with the brazing material and not deformed.

Alternatively, in this method of producing, the second bonding step may be carried out simultaneously with the first bonding step if the second metal layer is formed using the metal plate made of nickel or nickel alloy. In this case, since the second metal layer is made of nickel or nickel alloy, it is possible to carry out the first bonding step and the second bonding step simultaneously. For the first bonding step, it is applicable to braze with Ag—Cu—Ti-based brazing material for example.

In this case, it is preferable that an area of the second metal layer made of nickel or nickel alloy be larger than that of the first metal layer, because it is possible to prevent contact of copper of the first metal layer made of copper or copper alloy with aluminum of the brazing material bonding the cooler more reliably.

Furthermore in this case, in the second bonding step, an aluminum plate may be stacked on the second metal layer so that the first metal layer and the second metal layer, and the second metal layer and the aluminum plate may be bonded respectively by solid-phase diffusion bonding.

A power-module substrate with cooler of the present invention includes a ceramic board, a circuit layer made of copper or copper alloy, bonded on one surface of the ceramic board, a first metal layer made of copper or copper alloy, bonded on the other surface of the ceramic board, a second metal layer made of aluminum, aluminum alloy, nickel or nickel alloy, bonded on the first metal layer, and a cooler made of aluminum alloy, bonded on the second metal layer; in this substrate, metal atoms of a member bonded on the first metal layer exist in a diffused state in the first metal layer, and metal atoms of a member bonded on the second metal layer exist in a diffused state in the second metal layer.

It is desirable that a titanium layer be provided between the first metal layer and the second metal layer, and titanium in the titanium layer exist in a diffused state in the first metal layer and the second metal layer.

In this case, it is desirable that an area of the titanium layer be larger than that of the first metal layer.

In this power-module substrate with cooler, it is desirable that the second metal layer be made of aluminum or aluminum alloy.

Alternatively, in this power-module substrate with cooler, it is desirable that the second metal layer be made of nickel or nickel alloy.

In this case, it is desirable that an area of the second metal layer made of nickel or nickel alloy be larger than that of the first metal layer.

Furthermore, an aluminum layer may be provided between the second metal layer made of nickel or nickel alloy and the cooler.

Advantageous Effects of Invention

According to the present invention, in a power-module substrate, a cooler having low rigidity can be reliably bonded without deformation, because the cooler made of aluminum alloy can be brazed on a first metal layer made of copper or copper alloy in an atmosphere of nitrogen or argon by low pressing load. Although Al-based Mg-included brazing material is used for brazing, the first metal layer is not deformed, because the melted Al-based Mg-included brazing material is not in contact with the first metal layer made of copper or copper alloy owing to a second metal layer between the cooler and the first metal layer. It is possible to obtain a power-module substrate having low thermal resistance and high bonding reliability because they are brazed.

DESCRIPTION OF EMBODIMENTS

Below, embodiments of a power-module substrate with cooler and a method of producing thereof according to the present invention will be explained.

First Embodiment

Figure 1:
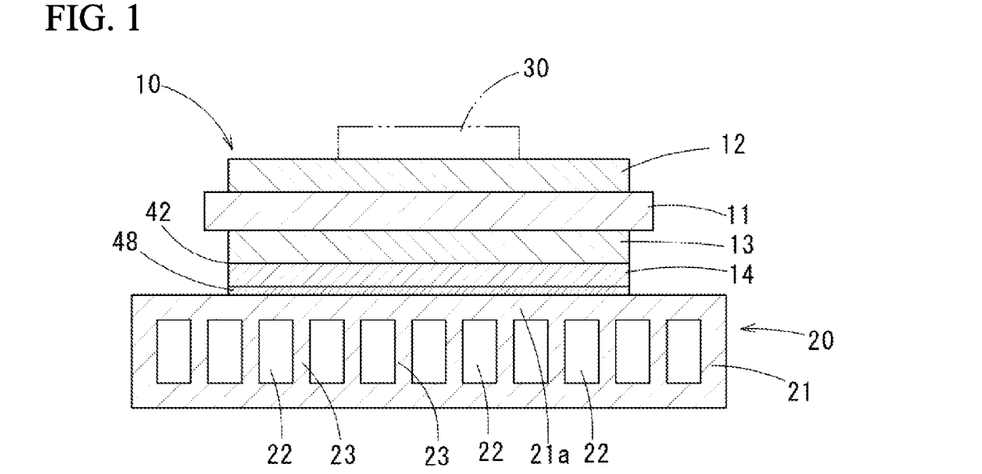
FIG. 1 is a vertical sectional view of a power-module substrate with cooler of a first embodiment according to the present invention.

A power-module substrate with cooler 10 shown in FIG. 1 is provided with a ceramic board 11, a circuit layer 12 bonded on one surface of the ceramic board 11, a first metal layer 13 bonded on the other surface of the ceramic board 11, a second metal layer 14 bonded on an opposite surface of the first metal layer 13 to the ceramic board 11, a cooler 20 bonded on the second metal layer 14, and a titanium layer 42 between the first metal layer 13 and the second metal layer 14. A reference symbol 48 in FIG. 1 denotes a bonding layer which is described later. A semiconductor element 30 is bonded on the circuit layer 12 by solder material as shown by the two-dot chain line in FIG. 1, so that a power module is formed.

The ceramic board 11 prevents electric connection between the circuit layer 12 and the first metal layer 13, and is made of aluminum nitride (AlN), silicon nitride ($Si_3N_4$), aluminum oxide ($Al_2O_3$) or the like. Especially, silicon nitride having high strength is preferable. A thickness of the ceramic board 11 is set in a range of 0.2 mm or more and 1.5 mm or less.

The circuit layer 12 is made of copper or copper alloy having excellent electric characteristic. The first metal layer 13 is also made of copper or copper alloy. The circuit layer 12 and the first metal layer 13 are formed, for example, by brazing copper plates of oxygen-free copper having purity of 99.96 mass % or more, for example, with active-metal brazing material. Thicknesses of the circuit layer 12 and the first metal layer 13 are set in a range of 0.1 mm to 1.0 mm.

The first metal member 13 is formed by bonding a metal plate 13' made of copper or copper alloy on the ceramic board 11. In this first metal layer 13, metal atoms of a member which is bonded on surfaces thereof are diffused.

The second metal layer 14 is formed by bonding a metal plate 14' made of aluminum, aluminum alloy, nickel or nickel alloy (in this embodiment, aluminum) on the first metal layer 13 by solid-phase diffusion bonding. A thickness of the metal plate 14' is set in a range of 0.1 mm to 1.0 mm when material thereof is aluminum or aluminum alloy, or 50 µm or more when it is nickel or nickel alloy. In the second metal layer 14, metal atoms of members which are bonded on surfaces thereof are diffused.

The cooler 20 is to radiate heat of the semiconductor element 30; and formed in a structure of a flat tubular body 21 in which coolant such as water or the like flows and partition walls 23 separating inside channels 22 formed along a thickness direction of the flat tubular body 21. This cooler 20 is made by, for example, extrusion molding of aluminum alloy (e.g., A3003, A6063 or the like). On the second metal layer 14 of the power-module substrate 10, a top plate 21a at a top side of the tubular body 21 of the cooler 20 is fixed by brazing.

The semiconductor element 30 is an electric part having semiconductor element, selected from various semiconductor elements such as IGBT (Insulated Gate Bipolar Transistor), MOSFET (Metal Oxide Semiconductor Field Effect Transistor), FWD (Free Wheeling Diode) and the like in accordance with necessary functions.

The semiconductor element 30 is bonded on the circuit layer 12 by solder bonding. The solder material is, for example, Sn—Sb, Sn—Ag, Sn—Cu, Sn—In, or Sn—Ag—Cu based solder material (so-called lead-free solder).

Figure 2A:
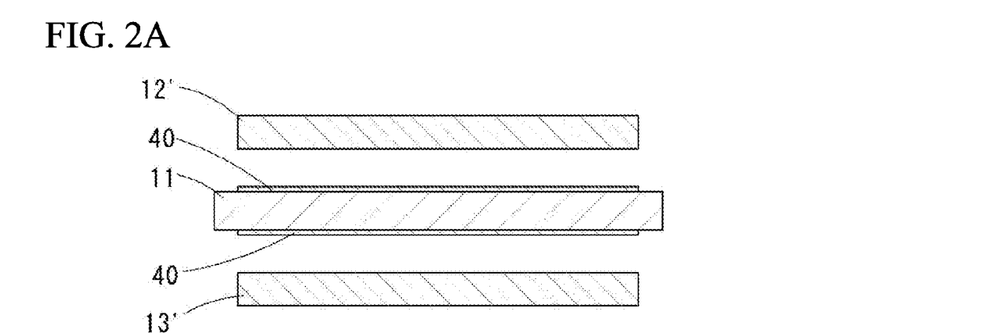
FIG. 2A is a vertical sectional view showing a first bonding step in a method of producing the power-module substrate with cooler in FIG. 1.

A method of producing the power-module substrate with cooler 10 structured as above will be explained referring FIG. 2A to FIG. 2C.

(First Bonding Step)

First, the circuit layer 12 is formed by bonding a metal plate 12' made of copper or copper alloy on one surface of the ceramic board 11; and the first metal layer 13 is formed by bonding the metal plate 13' made of copper or copper alloy one the other surface of the ceramic board 11. That is, as shown in FIG. 2A, brazing material coat layers 40 are formed by applying silver-titanium (Ag—Ti) based active-metal brazing material or silver-copper-titanium (Ag—Cu—Ti) based active-metal brazing material, for example, brazing paste of Ag-27 mass % Cu-2.0 mass % Ti, on both the surfaces of the ceramic board 11. Then, copper plates (the metal plates) 12' and 13' to be the circuit layer 12 and the first metal layer 13 respectively are stacked on the brazing material coat layers 40.

Figure 3:
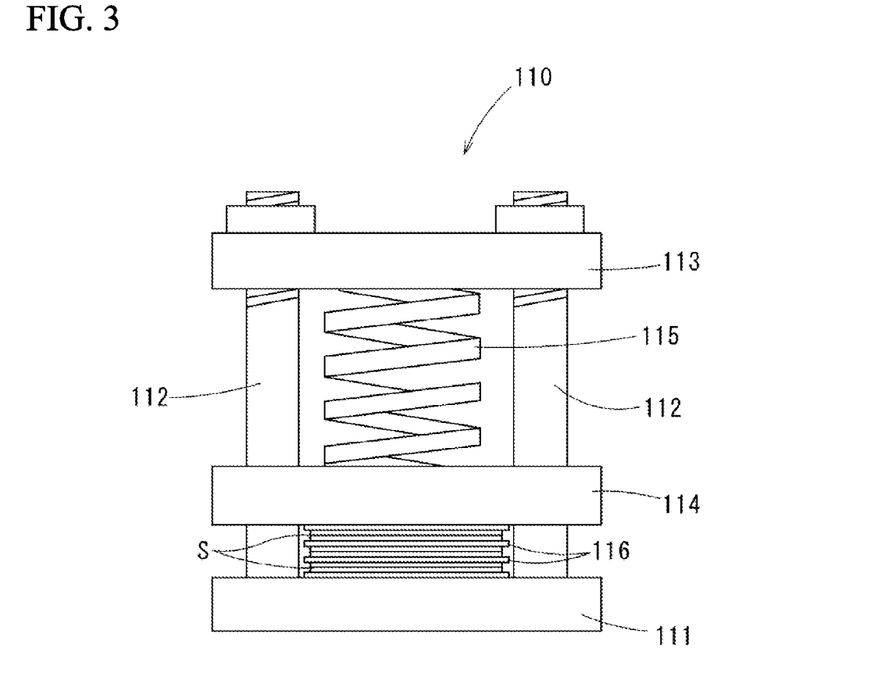
FIG. 3 is a frontal view showing an example of a press device used for the method of producing of FIGS. 2A to 2C.

Stacked bodies S of those are pressed in a stacking direction by a press device 110 shown in FIG. 3.

The press device 110 is provided with a base board 111, guide posts 112 vertically installed at four corners of top of the base board 111, a fixed board 113 fixed on top ends of the guide posts 112, a pressing board 114 held by the guide posts 112 so as to be vertically-movable between the base board 111 and the fixed board 113, and a biasing means 115 such as a spring installed between the fixed board 113 and the pressing board 114 and pressing the pressing board 114 downward.

The fixed board 113 and the pressing board 114 are arranged to be parallel with the base board 111. The stacked bodies S are arranged between the base board 111 and the pressing board 114. On both surfaces of the stacked bodies S, cushion sheets 116 are disposed in order to even pressure force. The cushion sheets 116 are formed from laminated sheets of carbon sheets and graphite sheets.

In a state in which the stacked bodies S are pressed by the press device 110, the press device is arranged in a heating furnace (not illustrated) and heated to bonding temperature in a vacuum atmosphere so that the copper plate 12' (the circuit layer 12) and the copper plate 13' (the first metal layer 13) are brazed to the ceramic board 12. Bonding condition for this case is, for example, set to a press force of 0.05 MPa or more and 1.0 MPa or less, the boning temperature of 800° C. or more and 930° C. or less, heating for 1 minute to 60 minutes.

This brazing is an active-metal brazing in which Ti that is an active metal in the brazing material is diffused first into the ceramic board 11 and forms titanium nitride (TiN), so that the copper plates 12' and 13' are bonded to the ceramic board 11 with silver-copper (Ag—Cu) alloy therebetween.

(Second Bonding Step)

Next, the metal plate 14' made of aluminum, aluminum alloy, nickel or nickel alloy and the first metal layer 13 are bonded by the solid-phase diffusion bonding, so that the second metal layer 14 is formed. That is, the second metal layer 14 is formed on a counter side surface of the first metal layer 13 to the ceramic board 11.

In this case, the metal plate 14' made of aluminum, aluminum alloy, nickel or nickel alloy (aluminum in this embodiment) to be the second metal layer 14 is stacked on the first metal layer 13, the stacked body of these is pressed by the above-described press device 110 and heated to the prescribed bonding temperature under the vacuum atmosphere, so that the second metal layer 14 bonded to the first metal layer 13 by the solid-phase diffusion bonding is formed.

Figure 2B:
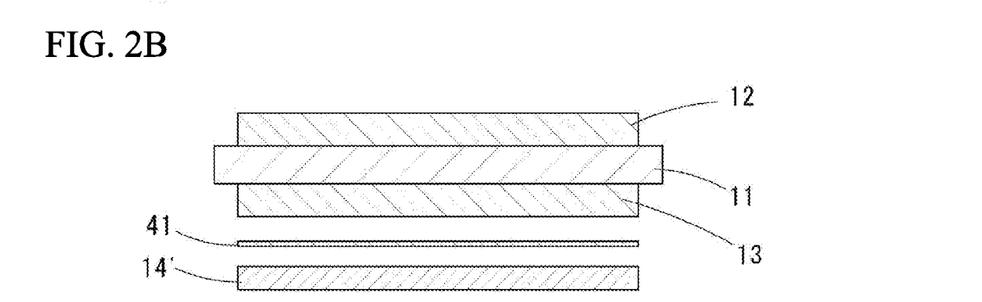
FIG. 2B is a vertical sectional view showing a second bonding step in the method of producing the power-module substrate with cooler in FIG. 1.
Figure 2C:
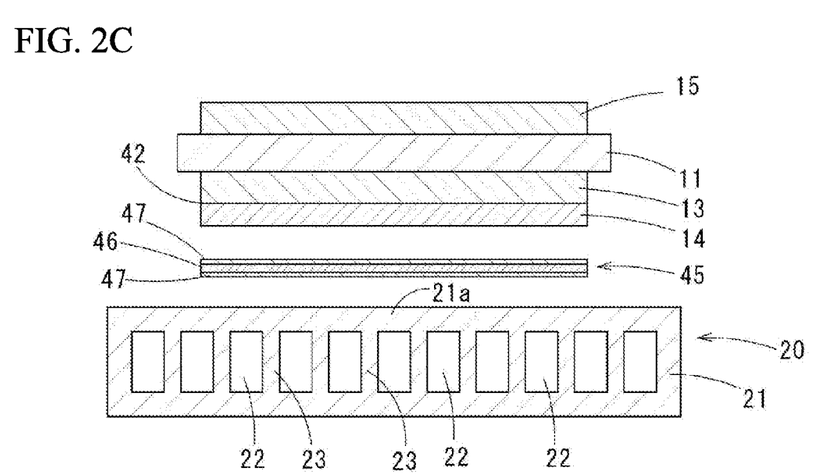
FIG. 2C is a vertical sectional view showing a third bonding step in the method of producing the power-module substrate with cooler in FIG. 1.

FIG. 2B shows a case in which the metal plate 14' made of aluminum, aluminum alloy, nickel, or nickel alloy (aluminum in this embodiment) is used for the second metal layer 14. This metal plate 14' and the first metal layer 13 are bonded by the solid-phase diffusion bonding with a titanium foil 41 therebetween. A thickness of the titanium foil 41 is set to 3 µm or more and 40 µm or less. It is pressed at 0.1 MPa or more and 3.4 MPa or less, and heated at bonding temperature 580° C. or more and 640° C. or less for 1 minute or more an 120 minutes or less under the vacuum atmosphere. As a result, the titanium foil 41 and the first metal layer 13, and the titanium foil 41 and the second metal layer 14 are solid-phase diffusion bonded respectively. And the titanium layer 42 is formed between the first metal layer 13 and the second metal layer 14. For the metal plate 14' made of aluminum or aluminum alloy, pure aluminum having purity 99% or more, 99.9% or more, or 99.99% or more, or aluminum alloy such as A3003, A6063 or the like can be used, for example.

As a result of this step bonding the first metal layer 13 and the metal plate 14' (the second metal layer 14) by the solid-phase diffusion bonding with the titanium foil 41 therebetween, Ti in the titanium layer 42 bonded on a surface of the first metal layer 13 is diffused in the first metal layer 13, Ti in the titanium layer 42 bonded on a surface of the second metal layer 14 is diffused also in the second metal layer 14.

(Third Bonding Step)

Next, the cooler 20 made of aluminum alloy is brazed on the second metal layer 14 using the Al-based Mg-included brazing material.

As this Al-based Mg-included brazing material, it is possible to use an Al—Si—Mg foil, an Al—Cu—Mg foil, an Al—Ge—Cu—Si—Mg foil or the like. As shown in FIG. 2C, it is also possible to use a double-side clad brazing material 45 in which the Al-based Mg-included brazing material is provided on both surfaces of a core material.

The double-side clad brazing material 45 of this embodiment is a clad material in which Al—Si—Mg based brazing material layers 47 are formed on both surfaces of a core material 46 made of aluminum alloy (e.g., A3003 material), and formed by stacking brazing materials on both the surfaces of the core material 46 and rolling them. A thickness of the core material 46 is 0.05 mm or more and 0.06 mm or less. Thicknesses of both the brazing material layers 47 are 5 µm or more and 100 µm or less.

Stacking the double-side clad brazing material 45 between the second metal layer 14 and the cooler 20, pressing them in the stacking direction by the press device 110 as FIG. 3, and heating them together with the press device 110 under a nitride atmosphere or an argon atmosphere, brazing is carried out. The press force is 0.001 MPa or more and 0.5 MPa or less for example. The bonding temperature is higher than eutectic temperature of Al and Cu, i.e., 580° C. or more and 630° C. or less.

In this third bonding step, the bonding temperature of brazing is higher than the eutectic temperature of Al and Cu. If the melted brazing material including Al is in contact with the first metal layer 13 made of copper or copper alloy, the first metal layer 13 made of copper or copper alloy is eroded, and deformation and the like of the first metal layer 13 may be occurred.

However, in this embodiment, since there is aluminum oxide on which the brazing material is hard to flow on the side surface of the second metal layer 14 made of aluminum, the melted Al-based Mg-included brazing material (Al—Si—Mg based brazing material in this embodiment) does not go through the side surface of the second metal layer 14 and is not in contact with the first metal layer 13, so that the first metal layer 13 is not deformed.

This is because the oxide on the side surface of the second metal layer 14 has an effect of a barrier to the brazing material when the melted Al-based Mg-included brazing material goes toward the second metal layer 14 and the first metal layer 13.

In this embodiment, although the bonding temperature is higher than the eutectic temperature of aluminum and copper in the third bonding step for brazing the cooler 20 on the second metal layer 14, since there is the titanium layer 42 at a boundary of the second metal layer 14 and the first metal layer 13, a liquid phase is not generated between aluminum of the second metal layer 14 and copper of the first metal layer 13 even when brazing of the third bonding step, and the first metal layer 13 is prevented from melting.

After this brazing, the thin bonding layer 48 which was the core material 46 of the double-side clad brazing material 45 remains between the second metal layer 14 and the cooler 20.

In the power-module substrate with cooler 10 manufactured as above, the circuit layer 12 and the first metal layer 13 are formed on both the surfaces of the ceramic board 11 respectively, and the cooler 20 made of aluminum is brazed on the first metal layer 13 with the second metal layer 14 made of aluminum or aluminum layer therebetween: accordingly, it is possible to braze with low load using Al-based Mg-included brazing material. Although the cooler 20 is brazed with Al-based Mg-included brazing material, the melted Al-based Mg-included brazing material is repelled at the side surface of the second metal layer 14 and not in contact with the first metal layer 13 made of copper or copper alloy, so that the first metal layer 13 is not deformed. Although the cooler 20 has relatively low rigidity because it is made of aluminum alloy and the channels 22 are formed therein; however, it can be reliably bonded without deformation of the cooler 20 since the brazing is carried out with low load.

The present invention is not limited to the above-described embodiments and various modifications may be made without departing from the scope of the present invention.

In the above-described embodiment, the structure has titanium layer 42 between the first metal layer 13 and the second metal layer 14 since the Al—Si—Mg brazing material having the melting point higher than the eutectic temperature of Al and Cu is used. If using Al-based Mg-included brazing material (e.g., Al-15Ge-12Si-5Cu-1Mg: melting point 540° C.) having melting point lower than the eutectic temperature of Al and Cu, it is possible to bond the first metal layer 13 and the second metal layer 14 directly by the solid-phase diffusion bonding without a titanium layer. In this case, metal atoms in the bonded second metal layer are diffused in the first metal layer 13; and metal atoms in the first metal layer are diffused in the second metal layer.

Furthermore in this case, the deformation of the first metal layer 13 is prevented. This is because temperature when brazing the cooler 20 to the second metal layer 14 is lower than the eutectic temperature of Al and Cu, so a liquid phase is not generated between aluminum of the second metal layer 14 and copper of the first metal layer 13.

For the cooler, it is not limited to the above-described structure and a flat board can be used; and the material is not limited to aluminum alloy, low thermal linear-expansion material of Al-based or Mg-based (e.g., AlSiC or the like) can be used.

Second Embodiment

Figure 4:
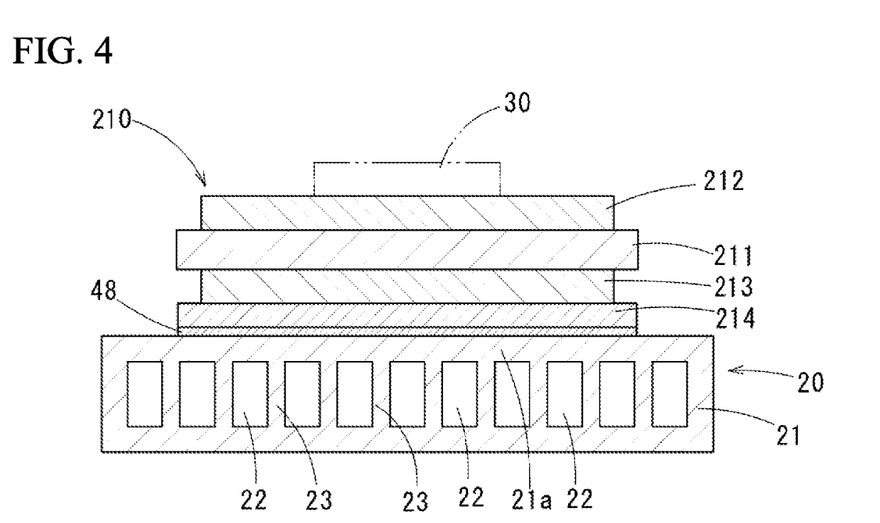
FIG. 4 is a vertical sectional view showing a power-module substrate with cooler of a second embodiment according to the present invention.

A power-module substrate with cooler 210 according to a second embodiment of the present invention is, as shown in FIG. 4, provided with a ceramic board 211, a circuit layer 212 made of copper or copper alloy and bonded on one surface of the ceramic board 211, a first metal layer 213 made of copper or copper alloy and bonded on the other surface of the ceramic board 211, a second metal layer 214 made of nickel or nickel alloy and bonded on the first metal layer 213, and the cooler 20 made of aluminum alloy and bonded on the second metal layer 214. Similarly to the first embodiment, a part of the double-side clad material used for brazing the cooler 20 remains between the second metal layer 214 and the cooler 20 as the bonding layer 48.

In this power-module substrate with cooler 210, Ni in the second metal layer 214 bonded on a surface of the first metal layer 213 is diffused in the first metal layer 213; and Cu in the first metal layer 213 bonded on a surface of the second metal layer 214 is diffused in the second metal layer 214.

In this power-module substrate with cooler 210, an area of the second metal layer 214 is larger than that of the first metal member 213. As a result, the brazing material which is melted for bonding the cooler 20 is prevented from reaching the first metal layer 213.

This power-module substrate with cooler 210 is manufactured by the same producing method as that of the above-described first embodiment. However, since the second metal layer 214 is made of nickel, it is possible to carry out the first bonding step and the second bonding step simultaneously. In this case, at the same time that metal plates respective to be the circuit layer 212 and the first metal layer 211 are brazed to the ceramic board 211 using a silver-titanium (Ag—Ti) based active-metal brazing material or a silver-copper-titanium (Ag—Cu—Ti) based active-metal brazing material, a metal plate to be the second metal layer 214 is bonded on a metal plate to be the first metal layer 211 by the solid-phase diffusion bonding.

Third Embodiment

Figure 5:
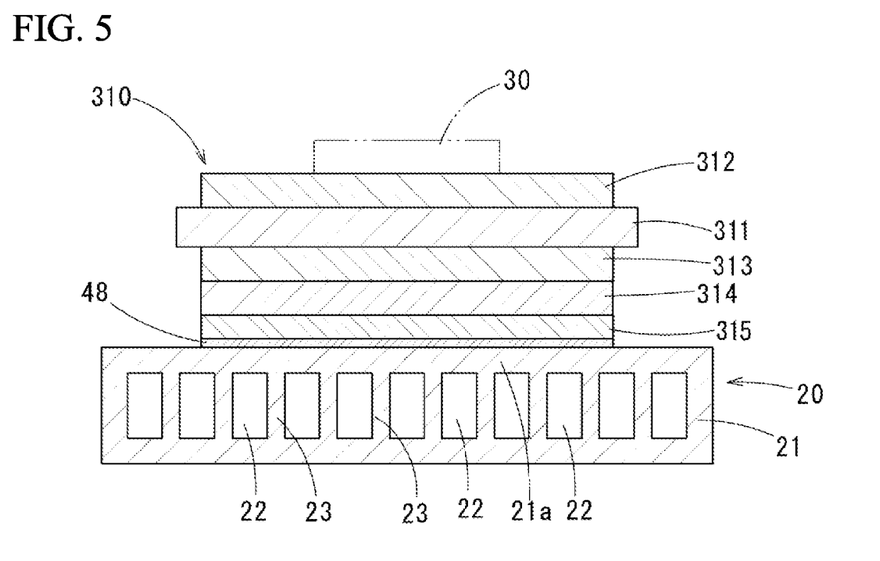
FIG. 5 is a vertical sectional view showing a power-module substrate with cooler of a third embodiment according to the present invention.

A power-module substrate with cooler 310 according to a third embodiment of the present invention is, as shown in FIG. 5, provided with a ceramic board 311, a circuit layer 312 made of copper or copper alloy and bonded on one surface of the ceramic board 311, a first metal layer 313 made of copper or copper alloy and bonded on the other surface of the ceramic board 311, a second metal layer 314 made of nickel or nickel alloy and bonded on the first metal layer 313, and the cooler 20 made of aluminum alloy and bonded on the second metal layer 314; and further provided with an aluminum layer 315 between the second metal layer 314 and the cooler 20. Similarly to the above-described embodiments, a part of the double-side clad material used for brazing the cooler 20 remains between the aluminum layer 315 and the cooler 20 as the bonding layer 48.

In this power-module substrate with cooler 310, Ni in the second metal layer 314 bonded on the first metal layer 313 is diffused in the first metal layer 313, and Cu in the first metal layer 313 bonded on one surface of the second metal layer 314 and Al in the aluminum layer 315 bonded on the other surface of the second metal layer 314 are diffused in the second metal layer 314.

Fourth Embodiment

Figure 6:
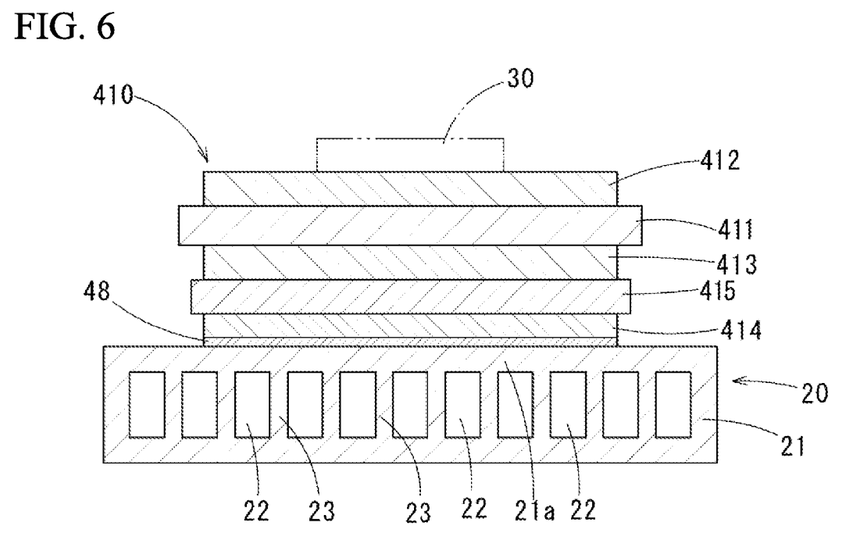
FIG. 6 is a vertical sectional view showing a power-module substrate with cooler of a fourth embodiment according to the present invention.

A power-module substrate with cooler 410 is, as shown in FIG. 6, provided with a ceramic board 411, a circuit board 412 made of copper or copper alloy and bonded on one surface of the ceramic board 411, a first metal layer 413 made of copper or copper alloy and bonded on the other surface of the ceramic board 411, a second metal layer 414 made of aluminum, aluminum alloy, nickel or nickel alloy and bonded to the first metal layer 413, and the cooler 20 made of aluminum alloy and bonded on the second metal layer 414; and further provided with a titanium layer 415 between the first metal layer 413 and the second metal layer 414. Similarly to the above-described embodiments, a part of the double-side clad material used for brazing the cooler 20 remains between the second metal layer 414 and the cooler 20 as the bonding layer 48.

In this power-module substrate with cooler 410, Ti in the titanium layer 415 bonded on surfaces of the first metal layer 413 and the second metal layer 414 is diffused in the first metal layer 413 and the second metal layer 414.

In this power-module substrate with cooler 410, an area of at least one of the second metal layer 414 and the titanium layer 415 is larger than that of the first metal layer 413. As a result, the brazing material melted when the cooler 20 is bonded is prevented from reaching the first metal layer 413.

INDUSTRIAL APPLICABILITY

Preventing a deformation when a metal layer made of copper or copper alloy is brazed to an aluminum-made cooler, a power-module substrate with cooler having small thermal resistance and high bonding reliability can be provided.

REFERENCE SIGNS LIST 10, 210, 310, 410 power-module substrate with cooler
11, 211, 311, 411 ceramic board
12, 212, 312, 412 circuit layer
13, 213, 313, 413 first metal layer
14, 214, 314, 414 second metal layer
12', 13' copper plate (metal plate)
14' metal plate
20 cooler
21 tubular body
21a top plate
22 channel
23 partition wall
30 semiconductor element
40 brazing material coat layer
41 titanium foil
42, 415 titanium layer
45 double-side clad brazing material (Al-based Mg-based brazing material)
46 core material
47 brazing material layer
48 bonding layer
315 aluminum layer

The invention claimed is:

1. A method of producing a power-module substrate with cooler comprising
a first bonding step of forming a circuit layer by bonding a metal plate made of copper or copper alloy on one surface of a ceramic board and forming a first metal layer by bonding a metal plate made of copper or copper alloy on the other surface of the ceramic board;
a second bonding step of forming a second metal layer by bonding a metal plate made of nickel or nickel alloy on the first metal layer by solid-phase diffusion bonding; and
a third bonding step of brazing a cooler made of aluminum alloy on the second metal layer with Al-based Mg-included brazing material;
wherein the second bonding step is carried out simultaneously with the first bonding step.

2. The method of producing a power-module substrate with cooler according to claim 1, wherein
in the second bonding step, with inserting a titanium foil between the first metal layer and the second metal layer, the first metal layer and the titanium foil, and the second metal layer and the titanium foil are bonded respectively by the solid-phase diffusion, and
in the third bonding step, with Al—Si—Mg-based brazing material, the second metal layer and the cooler are brazed.

3. The method of producing a power-module substrate with cooler according to claim 2, wherein an area of the titanium foil is larger than that of the first metal layer.

4. The method of producing a power-module substrate with cooler according to claim 1, wherein an area of the second metal layer is larger than that of the first metal layer.

5. The method of producing a power-module substrate with cooler according to claim 1, wherein in the second bonding step, an aluminum plate is further stacked on the second metal layer, and the first metal layer and the second metal layer, and the second metal layer and the aluminum plate are bonded respectively by solid-phase diffusion bonding.

* * * * *